(12) United States Patent    (10) Patent No.:     US 8,775,882 B2
Dimri                        (45) Date of Patent:     Jul. 8, 2014

(54) TESTING CIRCUITS

(75) Inventor: Ajay Kumar Dimri, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 235 days.

(21) Appl. No.: 13/162,784

(22) Filed: Jun. 17, 2011

(65) Prior Publication Data

US 2012/0166900 A1    Jun. 28, 2012

(30) Foreign Application Priority Data

Dec. 28, 2010   (IN) ............................ 3129/DEL/2010

(51) Int. Cl.
    *G01R 31/28*    (2006.01)
(52) U.S. Cl.
    USPC .......................................................... 714/726
(58) Field of Classification Search
    CPC ............... G01R 31/318525; G01R 31/318536; G01R 31/318541; G01R 31/318572; G01R 31/318555; G01R 31/318544
    USPC ...................... 714/726, 729, 724, 738; 326/16
    See application file for complete search history.

(56)    References Cited

U.S. PATENT DOCUMENTS

| | | | | | |
|---|---|---|---|---|---|
| 5,239,213 | A | * | 8/1993 | Norman et al. | 326/38 |
| 5,659,543 | A | * | 8/1997 | Ater et al. | 370/258 |
| 7,904,773 | B2 | * | 3/2011 | Wang et al. | 714/729 |
| 7,952,390 | B2 | * | 5/2011 | Takatori et al. | 326/93 |
| 7,962,886 | B1 | * | 6/2011 | Pandey et al. | 716/136 |
| 2003/0093733 | A1 | * | 5/2003 | Zhang | 714/726 |
| 2004/0025096 | A1 | * | 2/2004 | Rinderknecht et al. | 714/724 |
| 2004/0111658 | A1 | * | 6/2004 | Natsume | 714/752 |
| 2004/0153926 | A1 | * | 8/2004 | Abdel-Hafez et al. | 714/726 |
| 2007/0043989 | A1 | * | 2/2007 | Yokota | 714/726 |
| 2007/0126489 | A1 | * | 6/2007 | Prodanov et al. | 327/291 |
| 2008/0005632 | A1 | * | 1/2008 | Inoue | 714/724 |
| 2008/0270859 | A1 | * | 10/2008 | Mikami | 714/731 |
| 2009/0119561 | A1 | * | 5/2009 | Yokota et al. | 714/731 |
| 2009/0273383 | A1 | * | 11/2009 | Takatori et al. | 327/218 |
| 2010/0283497 | A1 | * | 11/2010 | Noguchi et al. | 324/762.01 |
| 2010/0318864 | A1 | * | 12/2010 | Funatsu | 714/726 |
| 2011/0185244 | A1 | * | 7/2011 | Mikami | 714/731 |

* cited by examiner

*Primary Examiner* — Albert Decady
*Assistant Examiner* — Osman Alshack
(74) *Attorney, Agent, or Firm* — Gardere Wynne Sewell LLP

(57)    ABSTRACT

A first circuit has a reset input. A second circuit is configured to be reset and provide an output. A test circuit is configured to test the first circuit and second circuit. The test circuit is configured such that a fault with the first circuit and said second circuit is determined in dependence on an output of the first circuit.

21 Claims, 5 Drawing Sheets

TESTING CIRCUITS

PRIORITY CLAIM

This application claims priority from Indian Application for Patent No. 3129/DEL/2010, filed Dec. 28, 2010, the disclosure of which is hereby incorporated by reference.

TECHNICAL FIELD

The present invention relates to circuits and in particular to testing circuits

BACKGROUND

ATPG (Automatic Test Pattern Generation) is used during the testing of integrated circuits. In particular, ATPG provides an input or test sequence which when applied to the circuit under test allows a distinction to be made between the correct circuit behavior and faulty circuit behavior. ATPG is generally used to test integrated circuits once they have been manufactured. ATPG may provide information which can be used to determine the cause of the faulty circuit behavior.

A stuck at fault model is used by ATPG tools in order to mimic a manufacturing defect within the integrated circuit. In this model, individual signals or pins are assumed to be stuck at a particular logic level, for example logic 1 or logic 0. This model assumes that one of the signal lines or pins is stuck at a particular logic value regardless of what inputs are provided to the circuit.

SUMMARY

In one embodiment, the circuit comprises: first circuitry having a reset input; second circuitry configured to be reset and provide an output; test circuitry configured to test said first circuitry and second circuitry, said circuit being configured such that a fault with said first circuitry and said second circuitry is determined in dependence on an output of said first circuitry.

BRIEF DESCRIPTION OF THE DRAWINGS

For a better understanding of some embodiments, reference will now be made by way of example only to the accompanying figures in which.

DETAILED DESCRIPTION OF THE DRAWINGS

Figure 1:
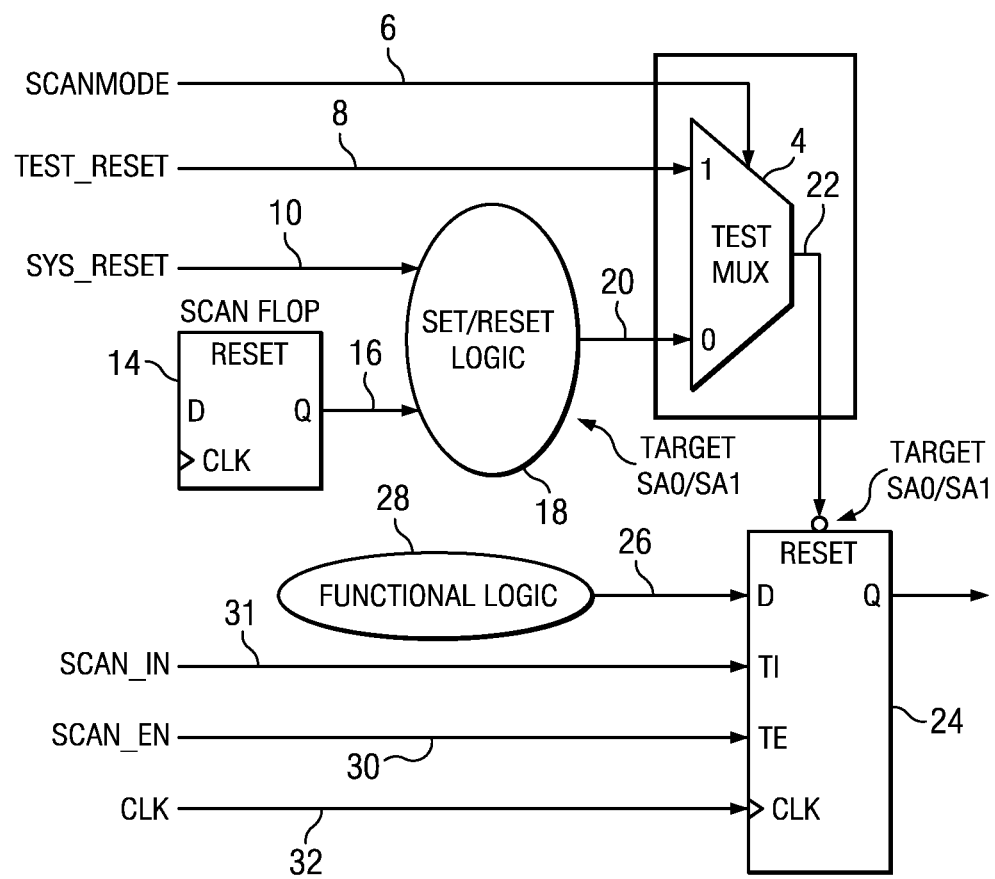
FIG. 1 shows a first arrangement for stuck at fault detection.

With ATPG, the functional reset logic path is usually bypassed and is not tested for manufacturing defects using standard based patterns. FIG. 1 shows an approach where the functional reset logic path is bypassed in the ATPG mode and is multiplexed with a separate test reset.

The arrangement of FIG. 1 comprises a test multiplexer 4. The test multiplexer 4 receives a first input from a test reset signal TEST_RESET 8. A scan mode signal SCANMODE 6 is used as the control input of the test multiplexer 4. In the arrangement shown in FIG. 1, set/reset logic 18 is provided. The set/reset logic is the functional reset logic path. The set/reset logic 18 is arranged to receive an input 16 from the Q output of a first scan flip-flop 14. The set/reset logic 18 is also configured to receive a system reset SYS_RESET signal 10. The set/reset logic 18 is configured to provide an output 20 which is provided to the second input of the test multiplexer 4.

The output 22 of the test multiplexer 4 provides the reset input of a second scan flip-flop 24. The reset input to the flip flop is an active low reset. This means that a low input to the reset pin will reset the flip flop. The second scan flip-flop 24 receives a clock signal CLK 32 at its clock input. The arrangement also comprises functional logic 28. The output 26 of the functional logic 28 provides an input to the D input of the second scan flip-flop 24. The second scan flip-flop 24 receives the scan enable signal SCAN_EN 30 at the test enable TE input. The second scan flip flop is also arranged to receive a scan input SCAN_IN 31 which allows test data to be input to the second scan flip flop 24.

The arrangement of FIG. 1 is configured to test for stuck at faults at the reset input. In particular, stuck at one and stuck at zero faults are tested.

Figure 2:
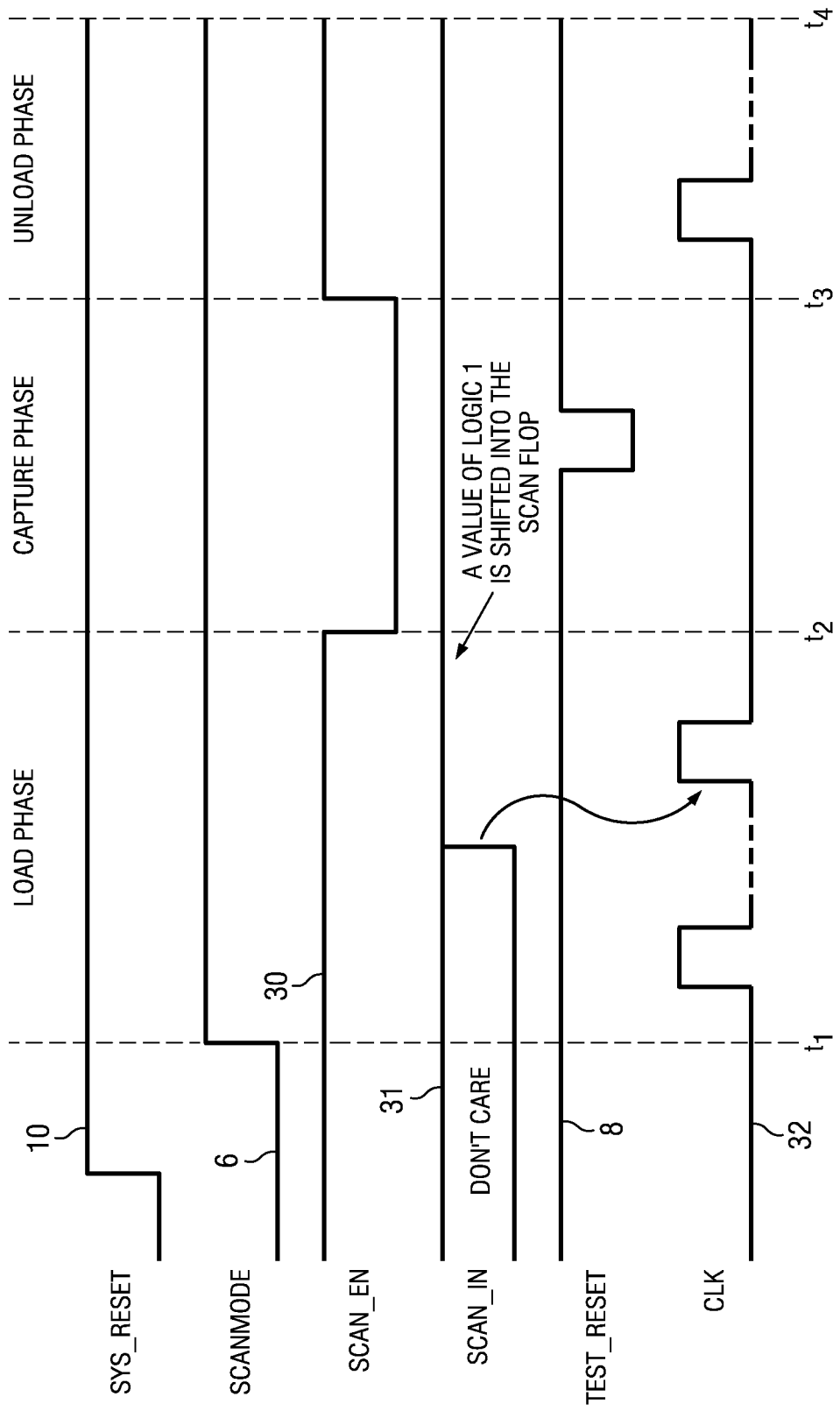
FIG. 2 shows a timing diagram associated with the arrangement of FIG. 1.

The operation of FIG. 1 will now be described with reference to the timing diagram of FIG. 2. The first line of FIG. 2 shows the system reset signal SYS_RESET 10. The second line shows the scan mode signal SCANMODE 6. The third line shows the scan enable signal SCAN_EN 30. The fourth line shows the data scanned into the scan flip-flop via the scan input 31. The fifth line shows the test reset signal TEST_RESET 8. The sixth line shows the clock signal CLK 32.

The timing diagram shows three timing stages. Between time t1 and time t2 is the load phase. The capture phase is between time t2 and t3. The unload phase is between time t3 and t4.

During the ATPG mode, stuck at faults at the scan flip-flop set/reset pins of the second flip-flop are tested. The second scan flip flop is loaded during the load phase with a logic 1 via the scan input 31. When the scan mode signal 6 is high, the test multiplexer 4 is configured to output the test reset signal 8 on its output 22. However since the scan mode signal selects the reset output, the output of the set/reset logic is not being tested. The scan mode signal 6 transitions from the low logic level to the high logic level at time t1 at the beginning of the load phase. The scan enable signal 30 is at the high logic level as is the test reset signal in the load phase. In practice because the test reset signal is high and the scan mode signal is high, then the output of the test multiplexer is high. This means that the flip flop is not reset. The second flip flop is loaded with test values which have been scanned in. The scanned in logic value or values may have a 1 level.

The capture phase will now be described. When the scan enable signal 30 goes to the low logic level, this means that a low input is provided to the test enable input. In practice, this means that the scan flip-flop operates in the normal mode, as opposed to the test mode. Accordingly, no further values on the scan input are loaded into the flip flop. As can be seen from FIG. 2, the test reset signal 8 is pulled to the low logic level for a short time between time t2 and t3. When the test reset signal 8 is pulled low, this means that the output of the test multiplexer is the low logic level, which means that the second flip flop should be reset. The flip flop has an active low reset. This means that the second flip-flop 24 is now in the reset mode. This means that the output of the flip flop should be low. However, when the test reset signal 8 goes back up to the logic high level, the second flip-flop 24 is put back into the normal mode. However the Q output is still low as no new data has been loaded since the resetting of the flip flop.

The unload phase will now be described. At time t3, the scan enable 30 goes back to the logic 1 level, thus putting the second scan flip-flop into the test mode. The reset signal will be low. This will mean that the Q output will output test values which are input to the scan input.

This assumes that there are no stuck at faults on the reset input. If the reset input is stuck at 1 (stuck in a non reset condition), the output of the flip flop is will be high, even when the test reset pulse is applied (which should cause the flip flop to reset and provide a low output). If the reset input is stuck at 0 (which keeps the flip flop in a reset state), the flip flop output is always zero (even when the test data is applied to the test input is one).

In summary, the second flip-flop under test is loaded with a logic value of 1. To test for a stuck at 1 fault for the reset pin, a pulse is applied to the test reset pin during the capture phase. This is between time t2 and t3 of FIG. 2. In order to test the stuck at 0 fault at the flip-flop reset pin, the test reset pin is held to the off state i.e. 1. This allows stuck at 0 and stuck at 1 faults of the set/reset pin to be detected. In particular, if the reset pin is stuck at 0 (i.e. the flip flop is stuck in the reset mode), the Q output will be at 0 even when the data at the scan input to the flip flop is high. If on the other hand, the set/reset pin is stuck at 1 (that is the non reset mode), the Q output will be the data D provided by the functional logic which can be set to a test pattern of 1, even when the test reset signal is pulsed low.

However, while the second flip-flop set/reset input can be tested for the stuck at 0 or stuck at 1 manufacturing defects, the functional reset logic path 18 and the reset applied to that circuitry is not tested as it is blocked during the ATPG test mode. In order to test the functional reset, separate functional patterns have to be generated which require exercising all the reset sources, that is the system reset from the input pad and the internally generated resets from the flip-flops.

Figure 3:
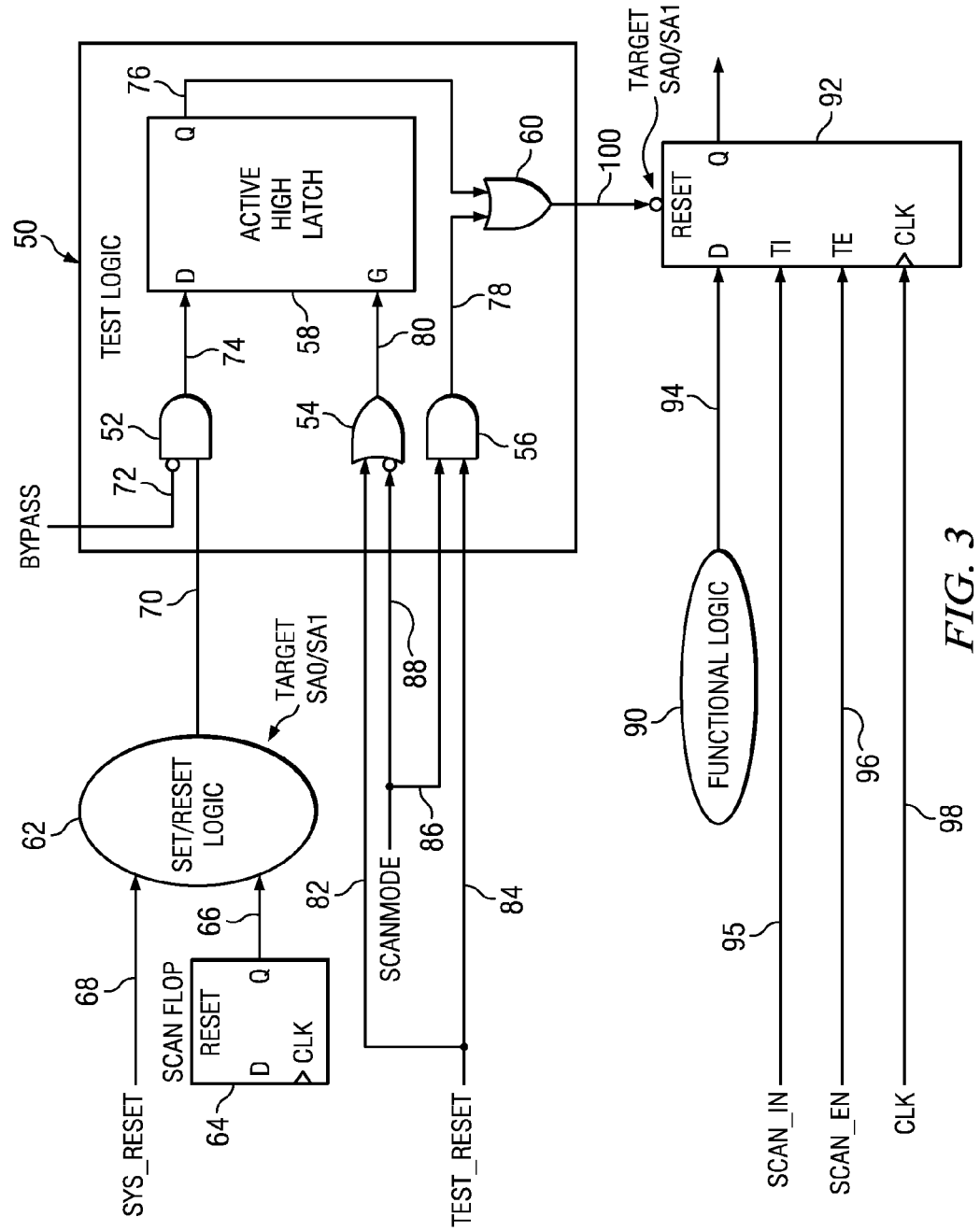
FIG. 3 shows an embodiment for stuck at fault detection.

Reference is now made to FIG. 3 which shows an embodiment. The arrangement of FIG. 3 comprises test logic 50. The test logic 50 comprises an AND gate 52 which is arranged to receive an inverted bypass signal 72 as a first input and an output 70 from set/reset logic 62 as a second input. The output 74 of the AND gate 52 is provided to the D input of an active high latch 58. The Q output 76 of the latch 58 is provided to the first input of a first OR gate 60. The second input of the first OR gate 60 is provided by the output of a second AND gate 56. The AND gate 56 receives the test reset signal 84 as a first input and a scan mode signal SCANMODE 86 as a second input. The test logic also comprises a second OR gate 54, the output 80 of which is provided to the G input of the latch 58. The second OR gate 54 receives as the first input the test reset signal 82 and as a second input, the scan mode signal 88 which has been inverted.

The set/reset logic 62 receives as an input the system reset signal SYS_RESET 68 and the output 66 of a first scan flip-flop 64. The output 100 of the first OR gate 60 is input to the reset pin of the second scan flip-flop 92. The second scan flip-flop 92 has an input 94 provided by functional logic 90. The scan enable signal SCAN_EN 96 is provided to the test enable input of the second scan flip flop and the clock signal CLK 98 is provided to the clock input. The second flip flop has an active low reset which means that the flip flop will be reset when a low logic level is applied to the reset input. The second flip flop further has a scan input SCAN_IN 95 which allows test values to be input during the test mode which is enabled by the test enable input.

In embodiments, the functional set/reset logic is tested using scan based patterns. In particular, ATPG patterns are generated bypassing the functional set/reset logic and allowing the test reset to control the set/reset pins of the scan flip-flops during load/unload vectors of the ATPG. The ATPG patterns are generated to gate the test reset in a controlled way during the capture phase of ATPG. The second scan flip-flop 94 under test is loaded with a logic value 1. The test mode is set by the scan enable signal being high and the logic value is loaded via the scan input 95.

Figure 4:
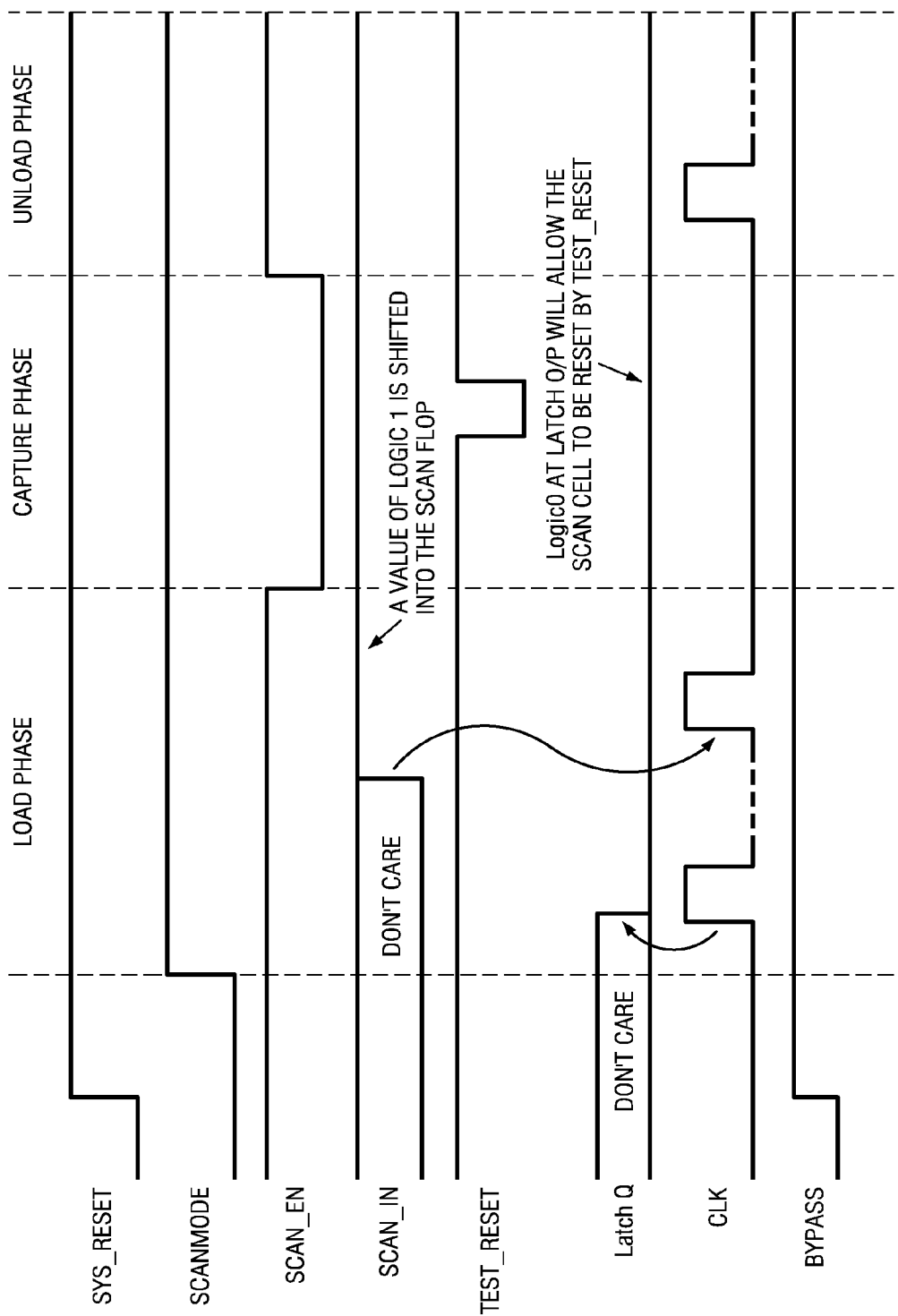
FIG. 4 shows a first timing diagram associated with the arrangement of FIG. 3.
Figure 5:
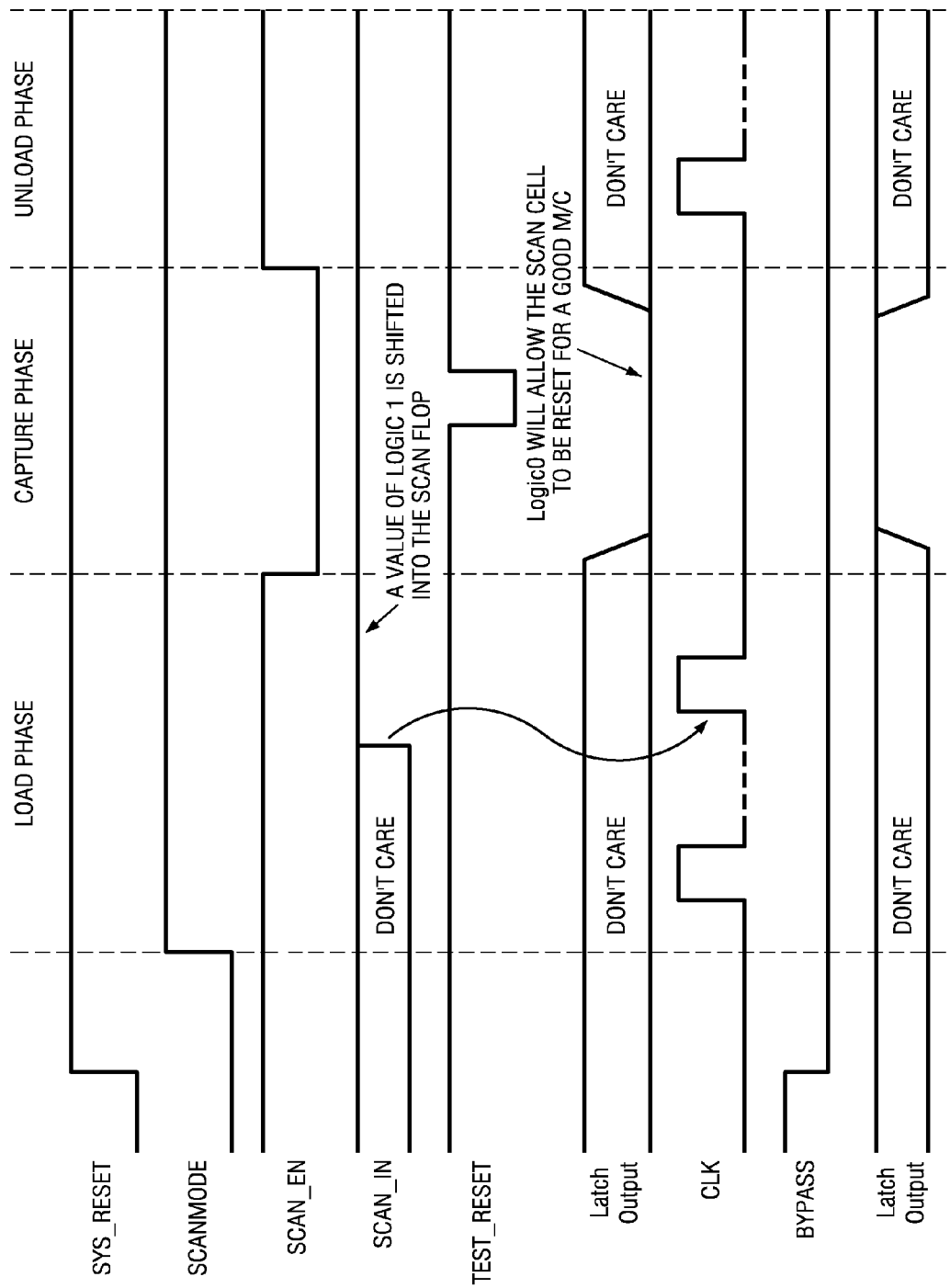
FIG. 5 shows a second timing diagram associated with the embodiment of FIG. 3.

Reference is now made to FIGS. 4 and 5 which show the timing diagrams associated with the circuit of FIG. 3. The first line of each timing diagrams show the system reset signal which is the same as that shown in FIG. 2. The second line shows the scan mode signal which again is the same as that shown in FIG. 2. Likewise, the scan enable signal and test reset signal are respectively shown on lines 3 and 5 and are the same as that shown in FIG. 2.

In FIG. 4, the fourth line is data scanned into the flip flop SCAN_IN. The sixth line is the output of the latch 58 when driving a logic 0. The next line shows the clock signal which is applied to the second flip flop 92. The final line is the bypass signal.

In FIG. 5, the fourth line is data scanned into the flip flop SCAN_IN. The sixth line is the output of the latch 58 when driving a logic 0. The next line shows the clock signal which is applied to the second flip flop 92. The next line is the bypass signal and the final signal is the output of the latch 58 when driving a logic 1.

As will be discussed in more detail, with the BYPASS input as a separate test signal, the user can bypass the functional reset logic as shown in the following figures. So first the faults can be targeted on the reset pin of the scan flops in a first pass. In the second pass the functional reset logic can be targeted.

Initially the scan flop under test is loaded with a logic value of '1' via the scan input during the capture phase. To test for a stuck at one fault of the scan cell reset pin a pulse on the TEST_RESET pin is applied during the during the capture phase. This is as previously discussed. To test for a stuck at zero fault of the scan cell reset pin hold the TEST_RESET pin to the OFF state i.e. '1'. Again this is as discussed above. It should be noted that when the reset pin is being test for stuck at faults, the bypass signal is high which means that the output of the first AND gate will be low. Hence the output to the OR gate 31 provided by the latch will be low. The scan mode signal is high and accordingly the output of the AND gate 56 will be the same as the TEST_RESET input. The output of the AND gate 56 is input to the OR gate 60. The output of the OR gate is thus controlled by the TEST_RESET signal. Thus both the stuck at 1 and stuck at 0 faults of the scan cell's set/reset pin are detected. FIG. 4 shows the timing diagram when the BYPASS signal is high and hence when the reset pin of the scan flip flop is being tested.

In the embodiment shown in FIG. 3, faults of the functional set/reset logic are testable due to the gating of the TEST_RESET with the latched value of the functional set/reset logic output as seen in the following. FIG. 5 shows the timing which is used when the functional set/reset logic is being tested. In the second pass, the BYPASS signal is low. This means that the output of the AND gate 52 is controlled by the output of the set/reset logic. The latch will therefore output the output of the set/reset logic to the OR gate 60. The output provided by the OR gate 60 will be high except when the TEST reset signal is pulsed low.

If the functional set/reset logic is set to drive a '1' then the TESET_RESET pulse will be gated and consequently if there is no fault with the functional set/reset logic the scan cell will not be reset when the TEST_RESET signal is pulsed low. If there is a fault in the functional set/reset logic and it does not actually drive a "1", the output of the latch 58 will be low. This means that when the TEST_RESET signal is pulsed low, the output of the OR gate 60 is pulsed low which resets the flip flop. Thus it can be determined if there is a fault in the set/reset logic. Thus a stuck at zero fault in the functional set/reset logic path will be detected.

If the functional set/reset logic drives a '0' then the TEST_RESET pulse will not be gated and the scan cell will be reset if the set/reset logic is working correctly. In the case of a problem with the set/reset logic, the scan cell will not be reset. If the functional set/reset logic is set to drive a '0' then the TSET_RESET pulse not be gated and consequently if there is no fault with the functional set/reset logic the scan cell will be reset when the TEST_RESET signal is pulsed low. If there is a fault in the functional set/reset logic and it does not actually drive a "0", the output of the latch 58 will be high. This means that when the TEST_RESET signal is pulsed low, the output of the OR gate 60 remains which does not reset the flip flop. Thus it can be determined that there is a fault in the set/reset logic. Thus a stuck at one fault in the functional set/reset logic path will be detected.

Various alternatives to the arrangement of the Figures may be made. For example the various logic gates can be replaced by other suitable logic gate combinations. The arrangement of FIG. 3 can be modified to have a second pass where the set/reset logic output is selected by the scan mode and/or bypass signal to be output to the reset pin of the flip flop.

Embodiments have been described as checking for stuck at faults at a reset input. This is by way of example and stuck at faults at other pins may be tested.

The scan flip flop may be replaced by any other suitable circuitry in some embodiments.

Embodiments of the invention may have the advantage that the full functional logic set/reset path will be detected for stuck at faults. The set/reset functional logic may range from simple circuitry to complex circuitry.

A test time reduction may be achieved as the functional patterns to test the various functional reset sources including the software reset, internally generated hardware reset (e.g. synchronized reset) will not be required. The test coverage may be increased.

It should be appreciated that that circuitry of FIG. 1 or 3, may be provided on an integrated circuit. This circuitry may allow the integrated circuit to be tested after manufacture.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a test flip flop having a data input, a test input, a test enable input, a set/reset input and an output, wherein the test flip flop is configured in a normal mode in response to the test enable input being in a first logic state to receive normal data through the data input, and configured in a test mode in response to the test enable input being in a second logic state to receive test data through the test input; and
   a test circuit operable to enable testing for a stuck at state fault with respect to the set/reset input of the test flip flop, comprising:
   a set/reset circuit configured to generate a set/reset signal;
   a latch circuit configured to latch the set/reset signal; and
   a logic gate configured to logically combine an output of the latch circuit with a test reset signal to generate an output signal for application to the set/reset input of the test flip flop.

2. The circuit of claim 1, wherein said stuck at state fault is detected when the test reset signal is passed by the logic gate if the output of the test flip flop changes to a state other than a reset state in response to normal data received at the data input.

3. The circuit of claim 1, wherein said stuck at state fault is detected when the test reset signal is passed by the logic gate if the output of the test flip flop remains in a reset state regardless of test data received at the test input.

4. The circuit of claim 1,
   wherein a stuck at set state is detected when the test flip flop is placed in the normal mode and the test reset signal is passed by the logic gate if the output of the test flip flop changes to a state other than a reset state in response to normal data received at the data input; and
   wherein a stuck at reset state is detected when the test flip flop is placed in the test mode and the test reset signal is passed by the logic gate if the output of the test flip flop remains in the reset state regardless of test data received at the test input.

5. The circuit of claim 1, wherein the set/reset circuit comprises a set/reset logic circuit having an output selectively gated by a bypass signal to an input of the latch circuit.

6. The circuit of claim 5, wherein a stuck at a first state for the set/reset logic circuit output is detected when the test reset signal is blocked by the logic gate and the output of the test flip flop changes to a reset state.

7. The circuit of claim 5, wherein a stuck at a second state for the set/reset logic circuit output is detected when the test reset signal is blocked by the logic gate and the output of the test flip flop changes to a reset state.

8. The circuit of claim 5,
   wherein a stuck at a first state for the set/reset logic circuit output is detected if the output of the test flip flop changes to a reset state; and
   wherein a stuck at a second state for the set/reset logic circuit output is detected if the output of the test flip flop changes to the reset state.

9. The circuit of claim 5, wherein said test circuit is configured to first test for a stuck at state fault with respect to the set/reset input and then test for a stuck at a second state for the set/reset output.

10. The circuit of claim 5, wherein the set/reset circuit further comprises a bypass logic circuit configured to bypass the output of the set/reset logic circuit and apply a fixed logic value to an input of the latch circuit in response to the bypass signal.

11. The circuit of claim 1, wherein the circuit is implemented as an integrated circuit and said test data comprises test data for testing operation of the integrated circuit.

12. A circuit, comprising:
   a first scan flip flop having a data input and an output;
   a second scan flip flop having a set/reset input, a data input and an output;
   set/reset logic having an input coupled to the output of the first scan flip flop and having an output; and
   a test circuit operable to enable testing test for a stuck at state fault with respect to the set/reset input of the second scan flip flop, comprising:

a bypass circuit comprising a first input coupled to an output of the set reset logic and a second input coupled to receive a bypass signal;

a data latch having an input coupled to an output of the bypass circuit and having an output; and a logic circuit configured to logically combine a signal output from the data latch and a test reset signal to generate a set/reset signal for application to the set/reset input of the second scan flip flop.

13. The circuit of claim 12, wherein a latching function of the data latch is controlled by said test reset signal.

14. The circuit of claim 12, wherein the set/reset logic further has an additional input coupled to receive a system reset signal.

15. The circuit of claim 12, further including functional logic circuitry having an output coupled to the data input of the second scan flip flop.

16. The circuit of claim 12, wherein the logic circuit comprises a logic OR gate.

17. The circuit of claim 12, wherein the bypass circuit comprises a logic AND gate.

18. A circuit, comprising:

a first scan flip flop having a data input and an output;

a second scan flip flop having a set/reset input, a data input and an output;

set/reset logic having an input coupled to the output of the first scan flip flop and having an output; and a test circuit operable to enable testing test for a stuck at state fault with respect to the set/reset input of the second scan flip flop, comprising:

a data latch having an input coupled to an output of the set/reset logic and having an output; and a logic circuit configured to logically combine a signal output from the data latch and a test reset signal to generate a set/reset signal for application to the set/reset input of the second scan flip flop.

19. The circuit of claim 18, wherein a latching function of the data latch is controlled by said test reset signal.

20. The circuit of claim 18, further including functional logic circuitry having an output coupled to the data input of the second scan flip flop.

21. The circuit of claim 18, wherein the logic circuit comprises a logic OR gate.

* * * * *